(12) United States Patent
You et al.

(10) Patent No.: US 7,277,035 B1
(45) Date of Patent: Oct. 2, 2007

(54) METHOD AND APPARATUS FOR REDUCING NOISE IN A DIGITAL-TO-ANALOG CONVERTER (DAC) HAVING A CHOPPER OUTPUT STAGE

(75) Inventors: Zhong You, Austin, TX (US); Brian David Trotter, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/428,108

(22) Filed: Jun. 30, 2006

Related U.S. Application Data

(60) Provisional application No. 60/729,685, filed on Oct. 24, 2005.

(51) Int. Cl.
*H03M 1/66* (2006.01)
(52) U.S. Cl. ...................... 341/144; 341/145
(58) Field of Classification Search ............... 341/144, 341/143, 150, 145
See application file for complete search history.

(56) References Cited

U.S. PATENT DOCUMENTS

| | | | |
|---|---|---|---|
| 6,177,896 B1* | 1/2001 | Min ........................... | 341/143 |
| 2006/0071834 A1* | 4/2006 | del Mar Charmarro et al. ........................ | 341/143 |
| 2006/0081605 A1* | 4/2006 | Oita et al. ................. | 219/494 |

* cited by examiner

*Primary Examiner*—Rexford Barnie
*Assistant Examiner*—Joseph Lauture
(74) *Attorney, Agent, or Firm*—Andrew M. Harris; Mitch Harris, Atty at Law, LLC

(57) ABSTRACT

A method and apparatus for reducing noise in a digital-to-analog converter (DAC) having a chopper amplifier output stage provides improved DAC performance. A switched-current output provided from a digital filter is coupled to the input of a chopper amplifier. The current switches are non-uniform, so that extra zeros are provided at the chopping frequency of the chopping amplifier, thereby reducing noise that would otherwise be aliased in-band at the output of the chopper amplifier. The current switches may include a first set of half-magnitude switches followed by a set of full-magnitude switches and finally by another set of half-magnitude switches having a size equal to that of the first set.

23 Claims, 3 Drawing Sheets

METHOD AND APPARATUS FOR REDUCING NOISE IN A DIGITAL-TO-ANALOG CONVERTER (DAC) HAVING A CHOPPER OUTPUT STAGE

CROSS-REFERENCE TO RELATED APPLICATIONS

This application claims priority under 35 U.S.C. §119(e) to U.S. Provisional Patent Application Ser. No. 60/729,685, filed on Oct. 24, 2005.

BACKGROUND OF THE INVENTION

1. Field of the Invention

The present invention relates generally to digital-to-analog converters (DACs), and more specifically, to noise reduction in a DAC having a chopper amplifier output stage.

2. Background of the Invention

Chopper amplifier output stages are frequently used to provide an analog output from digitally-switched circuits. The use of a chopper reduces or eliminates the effect of offset voltages and flicker noise at the chopper amplifier by effectively modulating the lower frequency range, including DC, to a frequency range that is easily removed by an analog filtering stage. The filtering stage either forms part of the response of the chopper amplifier or is provided in a successive analog filter stage. The chopping frequency effectively modulates the DC offset to multiples of the chopping frequency.

However, broadband noise or other noise sources that have a component near a multiple of the chopping frequency will similarly be aliased to an in-band frequency that increases the noise level of the DAC.

Therefore, it would be desirable to provide an improved DAC having a chopper amplifier output stage with reduced noise. It would be further desirable to provide such an improved DAC at low incremental cost.

SUMMARY OF THE INVENTION

The above stated objectives are achieved in a method and apparatus that reduce noise in a digital-to-analog converter (DAC) having a chopper amplifier output stage.

The apparatus is a circuit that includes a chopper amplifier and a digital filter including a switched current output coupled to the input of the chopper amplifier. The switched-current elements are non-uniformly weighted such that extra zeros are introduced at the chopping frequency of the chopper amplifier. The method is a method of operation of the circuit.

The elements of the digital filter may be current sources switched by a shift-register input that forms a finite impulse response (FIR) filter. The current levels of at least some of the elements are set to differ from the current levels of other elements in order to introduce additional zeros in the response of the filter.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention regards a method and apparatus for reducing noise in a digital-to-analog converter having a chopper amplifier output stage. The method and apparatus use a non-uniform set of elements in a filter preceding the chopper amplifier stage that introduce extra zeros in the response of the filter. The zeros are located at multiples of the chopping frequency, so that noise and other artifacts present at the chopping frequency and its odd harmonics are attenuated by a factor greater than they otherwise would be in a uniform filter design.

Figure 1:
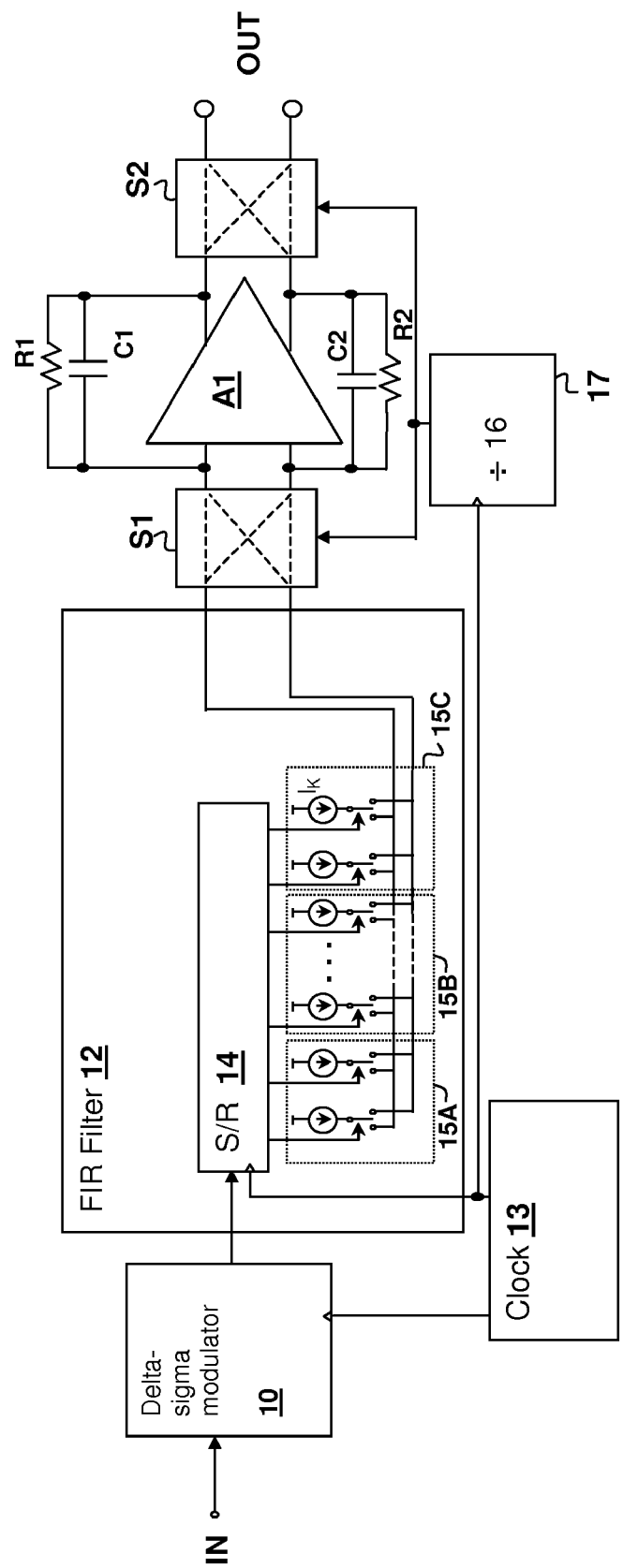
FIG. 1 is a schematic diagram depicting a digital-to-analog converter (DAC) in accordance with an embodiment of the present invention.

Referring now to FIG. 1, a digital-to-analog converter (DAC) in accordance with an embodiment of the present invention is shown. A digital input is supplied to a delta-sigma modulator 10 operated by a sampling clock 13 that provides an input to a finite impulse response (FIR) filter 12. The output of FIR filter 12 is provided to a chopper amplifier stage that includes a fully-differential amplifier A1, an input cross-point switch S1, and an output cross-point switch S2. Cross-point switches S1 and S2 provide the chopping action by reversing the input and output connections according to a chopping clock provided by divider 17 that in the exemplary embodiment, has a frequency of $\frac{1}{16}$ of the sampling clock frequency. Resistors R1, R2 and capacitors C1,C2 provide for low-pass filtering in the chopping stage that attenuates noise and artifacts provided from FIR filter 12 that lie above the chopping clock frequency. A separate filter may be included after amplifier A1 that removes artifacts at and above the chopping clock frequency.

FIR filter 12 is formed by a shift register 14 that receives the output of delta-sigma modulator 10 and controls a multiplicity of current sources $I_K$. A logical "1" value at a stage applies the current to one of the differential inputs of the chopping stage and a logical "0" value at a stage applies the current to the other differential input. By clocking the input values successively through shift register 14 and differentially summing the currents, a FIR filter is implemented. Prior art FIR filter circuits of the switching current type typically use only uniform current sources to implement the filtering operation. Such filters have a response described by a sinc function that repeats at a frequency equal to the sampling frequency divided by the number of taps. FIR filter 12 is modified to include a non-uniform current source set and has a modified response that provides the advantages of the present invention.

FIR filter 12 has three sets of current sources arranged as consecutive sets of taps. Each of the current sources in sets 15A and 15C have a magnitude of one-half the magnitude of the current sources in set 15B. The resulting response introduces extra zeros in the response of FIR filter 12. Sets 15A and 15C each include 8 half-magnitude current sources, and set 15B has 120 full-magnitude current sources.

Figure 2:
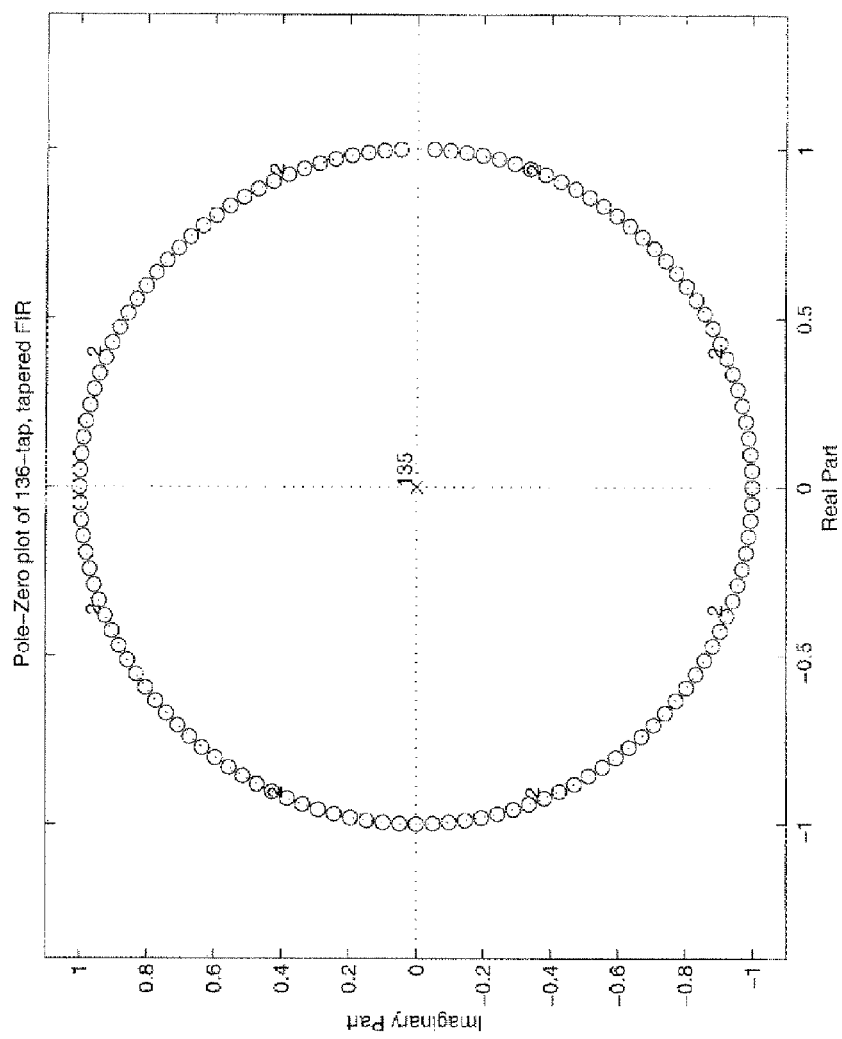
FIG. 2 is a pictorial diagram depicting a pole-zero plot of FIR filter 12 of FIG. 1.

A pole-zero plot of exemplary FIR filter 12 is shown in FIG. 2. 127 zero positions are distributed around the unit circle, as would be present for a prior art uniform FIR filter having 128 taps. However, at positions indicated by the symbol "2" on the figure, two zeros are present at those positions in the plot, due to the effective splitting of 8 of the taps into half-magnitude current source sets. Eight extra zeros are produced by the use of non-uniform current element arrangement in FIR filter 12, occurring at frequencies that are at odd multiples of the sampling rate divided by 16. The response has 135 poles at zero frequency corresponding to the number of zeros. The above described FIR filter 12 has a response that is a convolution of two filter responses: that of a 128-tap rectangular window, and that of a shorter 2-tap filter. In the exemplary FIR filter 12, the coefficients of the shorter 2-tap filter are given by: [0.5, 0, 0, 0, 0, 0, 0, 0, 0.5]. The shorter (2-tap) filter has zeroes at odd multiples of $\pi/8$ radians that yield zeros at odd multiples of $\frac{1}{16}$ the sampling frequency. In general, a FIR filter of length N, and having coefficients according to [0.5, 0, . . . 0, 0.5], will have zeroes at odd multiples of $\pi/(N-1)$ radians, or at odd multiples of twice the sampling frequency divided by N−1. Using the above relation, a 2-tap filter can be designed with zeroes at odd multiples of any even division of the sampling frequency.

Figure 3A:
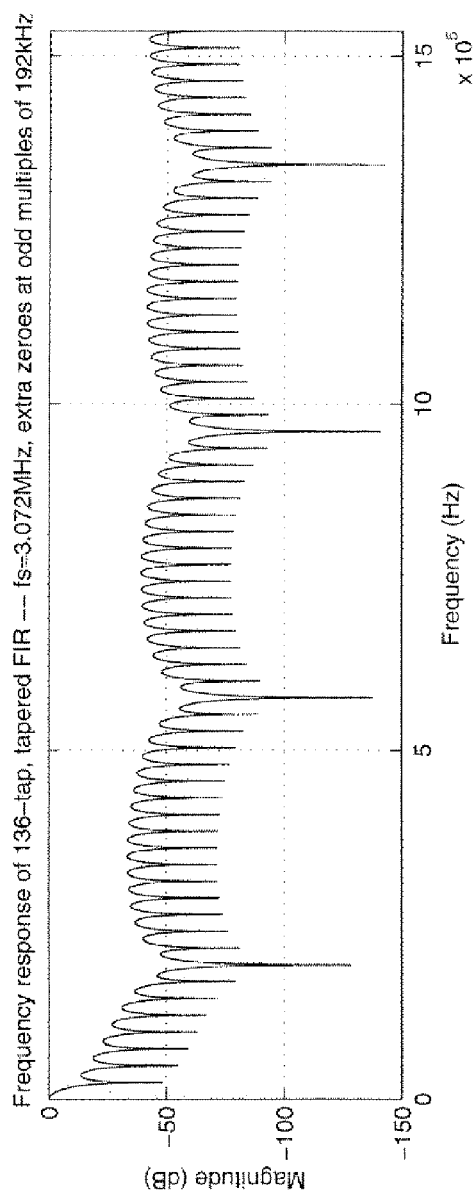
FIG. 3A is a pictorial diagram depicting an amplitude response of FIR filter 12 of FIG. 1.
Figure 3B:
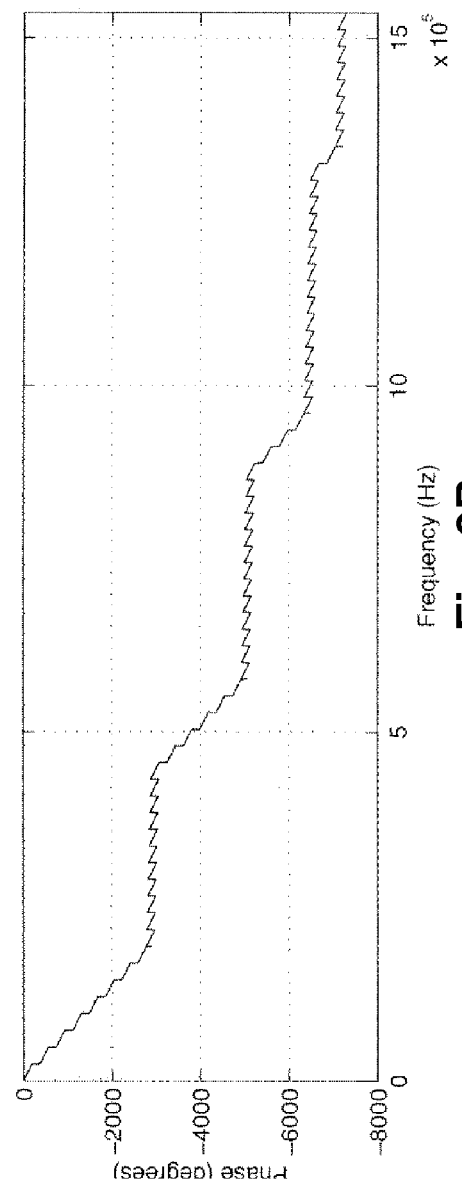
FIG. 3B is a pictorial diagram depicting a phase response of FIR filter 12 of FIG. 1.

The response of FIR filter 12 is depicted in FIG. 3A and FIG. 3B. FIG. 3A shows the amplitude response of FIR filter 12 and FIG. 3B shows the phase response. In the exemplary embodiment, for a sampling clock frequency of 3.072 MHz, the extra zeros, observable as the large dips in the amplitude response of FIG. 3A, occur at odd multiples of 192 kHz, which is the chopping frequency at which cross-point switches S1 and S2 toggle. Noise at the input of a chopper amplifier at even harmonics of the chopping frequency is not aliased by the chopper amplifier and therefore do not present the same problem as noise at the odd harmonics of the chopping frequency, since full periods of the even harmonics align with the half-periods of the chopping action.

The particular choice of frequencies, chopping frequency to sample frequency and number of stages in the exemplary embodiment, is not limiting and the filter can be adapted for other applications in accordance with other embodiments of the present invention. For example, the division factor of divider 17 could be set to 32 and the number of half-magnitude current sources in sets 15A and 15C set to 16 with 112 full-magnitude current sources employed in set 15B. The resulting response would have 127 zero positions and one pole as shown in FIG. 2, but sixteen extra zeros would occur at multiples of $\pi/8$ radians around the unit circle. For a sampling clock frequency of 3.072 MHz, the zeros would occur at odd multiples of 96 kHz, which is also the chopping frequency. Other clock ratio variations are possible, as well as choosing other placements of the non-uniform elements within the line of taps and setting magnitudes other than half-current for the non-uniform elements, to produce other responses.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A circuit, comprising:
   a digital filter having a switched-current output;
   a chopper amplifier having an input coupled to the switched-current output of the digital filter for chopping at least one signal provided to said input at a chopping frequency, and wherein current-switching elements of said digital filter have non-uniform magnitudes that provide multiple zeros near odd multiples of said chopping frequency.

2. The circuit of claim 1, wherein said current-switching elements include:
   a first set of at least three current-switching elements having a substantially equal first current magnitude; and
   a second set of at least three current-switching elements having a substantially equal second current magnitude.

3. The circuit of claim 2, wherein said second current magnitude is a rational multiple of said first current magnitude.

4. The circuit of claim 3, wherein said second current magnitude is twice said first current magnitude.

5. The circuit of claim 3, wherein said first set of current-switching elements have control inputs arranged in consecutive sequence with respect to said digital filter, and wherein said second set of current-switching elements are divided equally into two groups, one preceding the first set of current-switching elements and one following said first set of current-switching elements.

6. The circuit of claim 5, further comprising a shift register for receiving a digital value and controlling said current switching elements in sequence to perform a FIR filtering operation.

7. The circuit of claim 5, wherein the ratio of a total number of elements in said first set and said second set to a number of elements in said second set is equal to a ratio of a clocking frequency of said digital filter to said chopping frequency.

8. The circuit of claim 7, wherein the first set consists of 120 elements and the second set consists of 16 elements.

9. The circuit of claim 1, wherein said chopper amplifier implements a low-pass filter having substantial attenuation at frequencies above said chopping frequency.

10. The circuit of claim 1, further comprising a filter having an input coupled to an output of said chopping amplifier that implements a low-pass filter having substantial attenuation at frequencies above said chopping frequency.

11. The circuit of claim 1, further comprising a shift register for receiving a digital value and controlling said current switching elements in sequence to perform a FIR filtering operation.

12. A method of generating an analog signal from a digital representation, comprising:
   switching a set of current sources of non-uniform magnitude in a digital filter in response to said digital representation to generate at least one analog output signal, wherein a response of said switching has multiple zeros near odd multiples of a chopping frequency; and
   chopping said analog output signal at said chopping frequency.

13. The method of claim 12, wherein said switching switches current-switching elements that include a first set of at least three current-switching elements having a substantially equal first current magnitude and a second set of at least three current-switching elements having a substantially equal second current magnitude.

14. The method of claim 13, wherein said second current magnitude is a rational multiple of said first current magnitude.

15. The method of claim 14, wherein said second current magnitude is twice said first current magnitude.

16. The method of claim 14, wherein said switching switches a first set of current-switching elements in consecutive sequence with respect to said digital filter and said second set of current-switching elements as two groups of equal size, one preceding the first set of current-switching elements and one following said first set of current-switching elements.

17. The method of claim 16, further comprising shifting said digital representation with a shift register and wherein said switching controls said current switching elements in sequence according to said shifting to perform a FIR filtering operation.

18. The method of claim 16, wherein the ratio of a total number of elements in said first set and said second set to a number of elements in said second set is equal to a ratio of a clocking frequency of said digital filter to said chopping frequency.

19. The method of claim 18, wherein the first set consists of 120 elements and the second set consists of 16 elements.

20. The method of claim 12, further comprising filtering a result of said chopping to provide substantial attenuation above said chopping frequency.

21. The method of claim 12, further comprising shifting said digital representation with a shift register and wherein said switching controls said current switching elements in sequence according to said shifting to perform a FIR filtering operation.

22. A digital-to-analog converter, comprising:
a shift-register;
a plurality of current sources, wherein each of said current sources is controlled by a corresponding output of said shift-register to provide a filter response, and wherein a magnitude of said current sources is non-uniform so that multiple zeros near odd multiples of said chopping frequency are provided in said filter response; and
a chopper amplifier having an input coupled to the switched-current output of the digital filter for chopping at least one signal provided to said input at said chopping frequency.

23. The digital-to-analog converter of claim 22, wherein said current-switching elements include:
a first set of at least three current-switching elements having a substantially equal first current magnitude; and
a second set of at least three current-switching elements having a substantially equal second current magnitude, wherein said second current magnitude is one half of said first current magnitude.

* * * * *